(12) United States Patent
Sanada

(10) Patent No.: US 6,285,040 B1
(45) Date of Patent: Sep. 4, 2001

(54) INTERNAL-LOGIC INSPECTION CIRCUIT

(75) Inventor: Masaru Sanada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/471,123

(22) Filed: Dec. 23, 1999

(30) Foreign Application Priority Data

Dec. 28, 1998 (JP) ................................. 10-373763

(51) Int. Cl.$^7$ ................................. H01L 23/58
(52) U.S. Cl. ................. 257/48; 257/368; 257/461
(58) Field of Search ............... 257/48, 368, 461, 257/462, 290, 291, 292

(56) References Cited

U.S. PATENT DOCUMENTS

| 5,329,139 | * | 7/1994 | Sanada ................................. 257/48 |
| 6,169,408 | * | 1/2001 | Kantor et al. ........................ 324/752 |

FOREIGN PATENT DOCUMENTS

363040876 * 2/1988 (JP) .
5-21739 1/1993 (JP) .
5-315417 11/1993 (JP) .
10-242395 9/1998 (JP) .

OTHER PUBLICATIONS

Japanese Office Action dated Nov. 1, 2000, with partial translation.
F.J. Henley, "Logic Failure Analysis of CMOS VLSI Using A Laser Probe," IEEE 1984, On International Reliability Physics Symposium, pp. 69–75.

* cited by examiner

*Primary Examiner*—Nathan Flynn
*Assistant Examiner*—Remmon R. Fordé
(74) *Attorney, Agent, or Firm*—McGinn & Gibb, PLLC

(57) ABSTRACT

An internal-logic inspection circuit in an LSI includes a MOSFET having a first diffused region connected to an internal node of an internal circuit, a second diffused region connected to a diode and a gate connected to a pad. The diode is irradiated with a laser beam while the gate of MOSFET is applied with a gate voltage, and a resultant current is measured for judging the level of the internal node. The diode can be disposed in a space where overlying interconnects are not disposed.

9 Claims, 12 Drawing Sheets

INTERNAL-LOGIC INSPECTION CIRCUIT

BACKGROUND OF THE INVENTION (a) Field of the Invention

The present invention relates to an internal-logic inspection circuit and, more particularly, to a device structure and a layout of a semiconductor device such as LSI for inspecting the logic levels of internal nodes therein with a non-contact and non-destructive technique by using a laser beam. The present invention also relates to a method for internal-logic inspection of a semiconductor device.

(b) Description of a Related Art

An internal-logic inspection technique using a laser beam is generally employed for a logical verification of internal logic in an LSI. Conventional internal-logic inspection techniques include one such as proposed in "Logic Failure Analysis of CMOS VLSI using a Laser Probe", IEEE 1984, on International Reliability Physics Symposium, pp. 69–75 by F. j. Henley.

FIGS. 1A and 1B are circuit diagram of a CMOSFET in the internal circuit of an LSI and a sectional view thereof, respectively, with reference to which the principle of the proposed technique will be described. In FIG. 1A, the CMOSFET includes a p-ch transistor and an n-ch transistor connected in series between VDD line and the ground. In FIG. 1B, each of the FETs has a source region 51 or 61 formed on a p-type silicon substrate (p-sub) 50 and connected to VDD line (high voltage source line) or ground line (low voltage source line), a drain 52 or 62 connected to an output node OUT, and a gate electrode 53 or 63 connected to an input terminal IN.

Referring to FIG. 2, the drain region 62 of the nMOSFET shown in FIG. 1B is irradiated by a laser beam for logic inspection. The laser beam is irradiated by YAG having a wavelength of 1.06 μm which has a sufficient energy for exciting the p-n junction formed by the drain region 62 and the substrate 50. If the input voltage is high, the pMOSFET is OFF and the nMOSFET is ON, whereby the output node OUT assumes a low level. The laser beam irradiated onto the drain region 62 of the nMOSFET generates electron-hole pairs in the drain region 62. The electrons are drained through the channel and the source region 61 of the nMOSFET toward the ground line, whereas the positive holes are drained toward the ground line through the substrate 50 and a substrate electrode 64, which provides a reverse bias for the p-type substrate. The positive holes and electrons are then subjected to recombination in the vicinity of the substrate electrode 64, and thus current is not detected in the ground line.

Referring to FIG. 3, if the input voltage is low, the pMOSFET is ON and the nMOSFET is OFF, whereby the output node OUT assumes a high level. When the laser beam is irradiated onto the drain region 62 of the nMOSFET, electron-hole pairs are generated. The electrons thus generated are drained to VDD line through the pMOSFET, whereas positive holes are drained to the ground line through the p-type substrate 50 and the substrate electrode 64, whereby small current can be detected in the ground line by a small-range ammeter. The presence or absence of the small current $I_{ph}$ informs the output level of the CMOSFET at this stage. That is, if the small current is not detected, it shows a low level of the output node OUT, and if the small current is detected, it shows a high level of the output node OUT.

The conventional logic inspection techniques include one described in Patent Publication JP-A-5-21739, wherein a node connecting an output of a transistor element and an input of a succeeding transistor element is electrically connected to a diffused region electrically separated from other diffused regions and having a conductivity type opposite to the conductivity type of the semiconductor substrate, and the node thus formed is irradiated by a laser beam for logic inspection thereof.

FIG. 4 shows an example of the irradiation node described in the Patent Publication, wherein an n-type diffused region 65 is formed as the irradiation node in the surface region of a p-type substrate 50 and connected to an interconnect 66 connecting the output node OUT of an internal CMOSFET and an input node of another internal circuit. Adjacent to the irradiation node 65, a substrate electrode 64 is provided and connected to the ground line for electric separation by a reverse bias voltage.

Referring to FIG. 5, the irradiation node 65 shown in FIG. 4 is irradiated by a laser beam for internal logic inspection. If the input terminal of the CMOSFET is applied with a high level to turn OFF the pMOSFET and turn ON the nMOSFET, the positive holes and electrons generated by the laser beam as electron-hole pairs are drained through the interconnect or the substrate 50 to the ground line, wherein the electrons and positive holes are recombined. Thus, current $I_{ph}$ flowing to the VDD line is not detected in the case of a high level of the input signal.

Referring to FIG. 6, the irradiation node 65 shown in FIG. 4 is irradiated by a laser beam in the case of a low level of the input signal for the CMOSFET. In this case, the electrons are drained to VDD line through the p-ch transistor, whereas the positive holes are drained to the ground line through the substrate electrode 64. Thus, current Iph flowing to the VDD line is detected in the case of a low level of the input signal.

In the mean time, a situation has arisen in the state of art semiconductor devices, wherein the delay time caused by the line length is not negligible compared to the delay time in the transistor elements due to the reduction in the transistor dimensions.

FIG. 7 shows the relationship between the line length and the propagation delay generated by the line length, the relationship being specified by delay standards D1 and D2 which depend on the device dimensions, i.e., D1 corresponds to a larger transistor dimension and D2 corresponds to a smaller transistor dimension. As shown in the drawing, in the range L1 of the line length larger than a specified length LT, the propagation delay denoted by G1 and caused by the line length dominates in the signal delay with respect to the delay time D2 caused by the parasitic capacitance or parasitic resistance of the device elements in next generations of the semiconductor device having smaller device dimensions. Thus, it is desired that the circuit design reduce the line length for a higher operational speed of the semiconductor devices.

In a multi-layered interconnect structure in the semiconductor devices, there are variety of improvements wherein the parasitic capacitances of the signal lines are reduced by using the top interconnect layers as electrode lines, wherein resistance to noise in the supply voltage is improved by making the power source lines to cover almost the whole area for the semiconductor chip, and wherein a further high-performance semiconductor devices are achieved by an increase in the number of layers up to five or above to thereby reduce the potential difference in the signal lines.

In the improvements as described above, the internal-logic inspection technique using a laser beam has a problem in that the area for irradiating the laser beam is extremely limited due to the overlying interconnect layers covering almost whole area of the chip. This results in that the drain of the MOSFET cannot be irradiated by the laser beam in the first conventional technique, and results in that the irradiation node in the second conventional technique is located in the outer periphery of the semiconductor chip, which in turn causes a larger line length or larger transmission delay and degrades the electric characteristics of the semiconductor devices.

SUMMARY OF THE INVENTION

It is an object of the present invention to provide an internal-logic inspection circuit in a semiconductor device, i.e., a built-in circuit for internal-logic inspection by using laser irradiation, which is capable of allowing the logic inspection for an internal node substantially without degrading the operational speed or electric characteristics of the semiconductor device.

The present invention provides a semiconductor device including: a first-conductivity-type substrate; an internal circuit formed on the substrate and having an internal node for signal transmission; a MOSFET including a second-conductivity-type diffused region formed on the substrate, and a gate electrode overlying the diffused region for separating the diffused region to first and second regions, the first region being connected to the internal node; and a judgement diode having a p-n junction formed of the substrate and a third region formed on the substrate and having a second-conductivity-type, the third region being connected to the second region.

In accordance with the semiconductor device of the present invention, the third region for laser irradiation can be disposed apart from the internal node substantially without increasing the transmission delay at the internal node, because the MOSFET which is turned ON during the laser irradiation can be disposed in the vicinity of the internal node for prevention of increase in the parasitic capacitance of the input node during a normal operation mode of the semiconductor device.

The above and other objects, features and advantages of the present invention will be more apparent from the following description, referring to the accompanying drawings.

PREFERRED EMBODIMENTS OF THE INVENTION

Figure 1A:
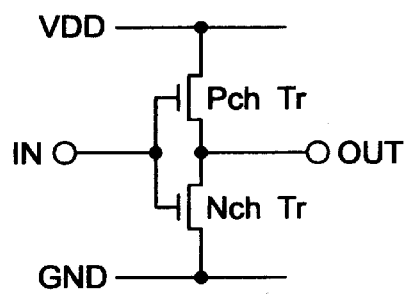
FIGS. 1A and 1B are circuit diagram and a sectional view, respectively, of a general CMOSFET subjected to an internal-logic inspection.
Figure 1B:
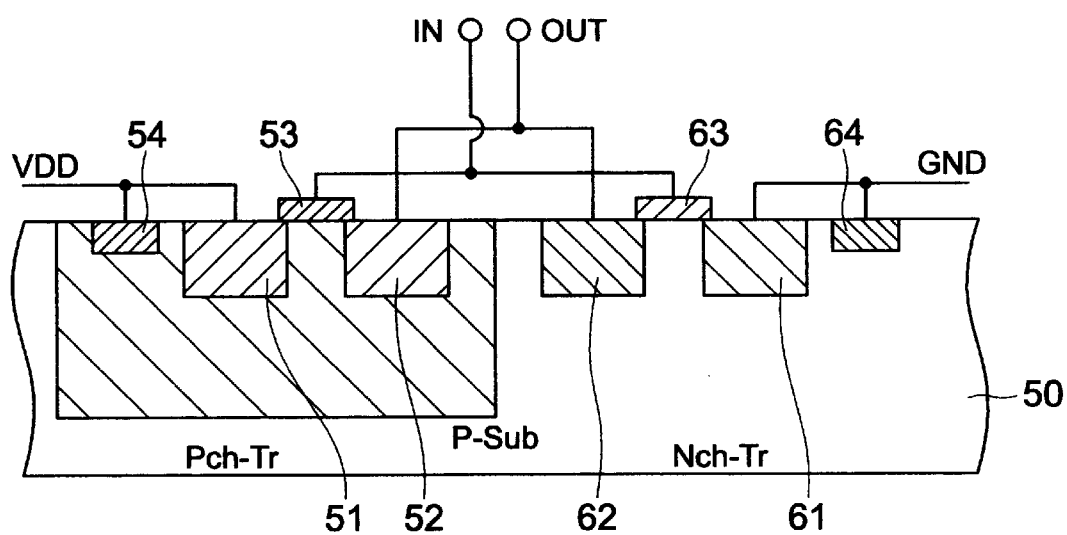
Figure 2:
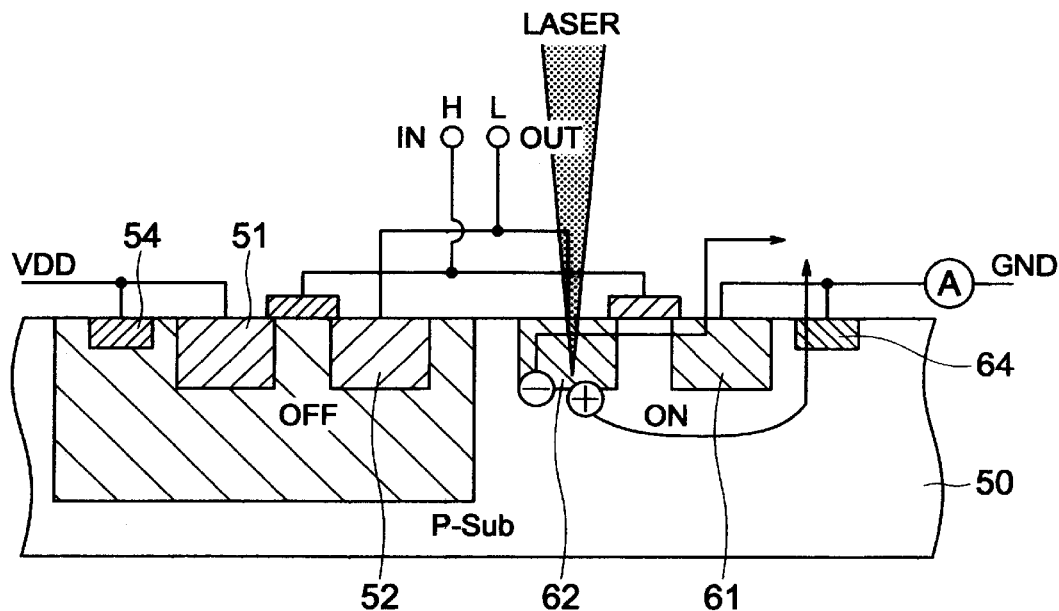
FIG. 2 is a sectional view for showing laser irradiation onto the CMOSFET of FIGS. 1A and 1B in the case of a high level of the input signal.
Figure 3:
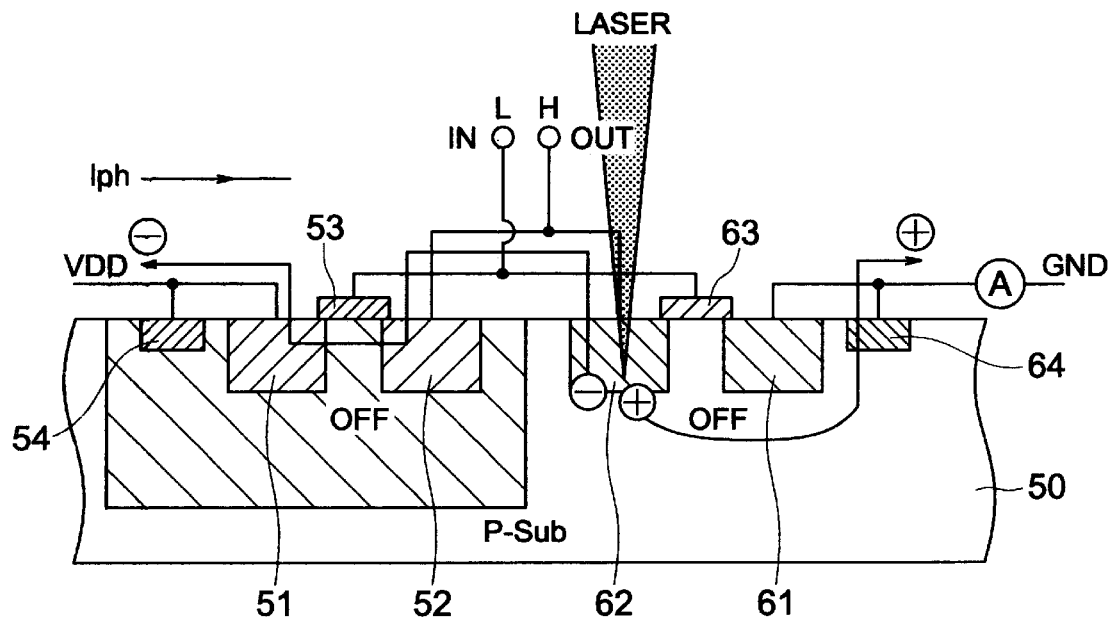
FIG. 3 is a sectional view for showing laser irradiation onto the CMOSFET of FIGS. 1A and 1B in the case of a low level of the input signal.
Figure 4:
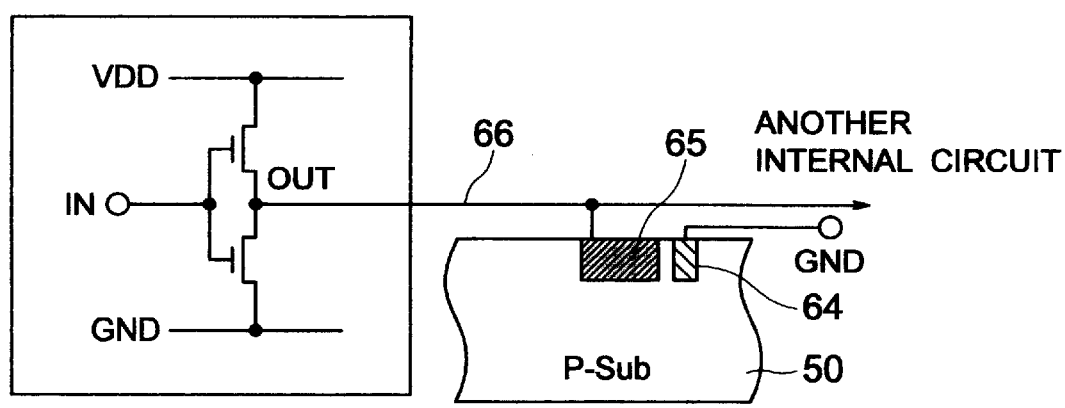
FIG. 4 is a schematic sectional view of an internal-logic inspection circuit proposed in a publication.
Figure 5:
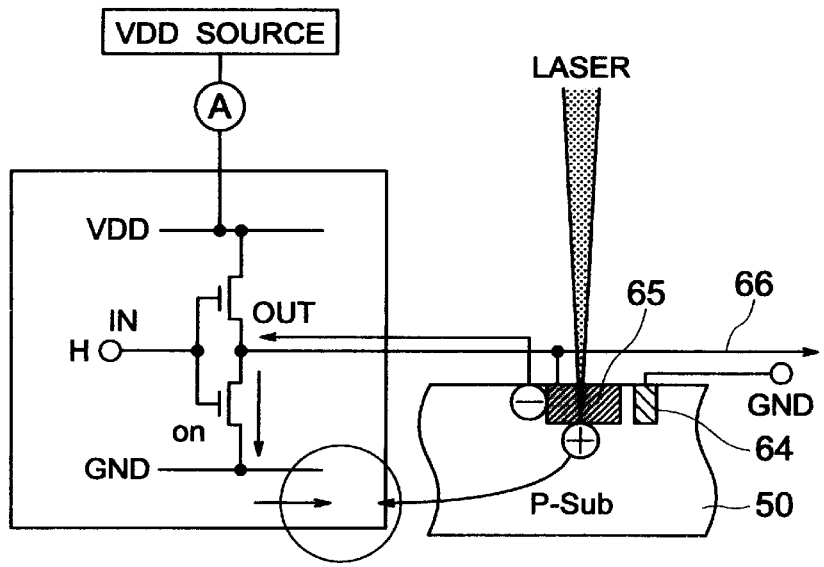
FIG. 5 is a sectional view for showing laser irradiation onto the irradiation node shown in FIG. 4 in the case of a high level of the input signal.
Figure 6:
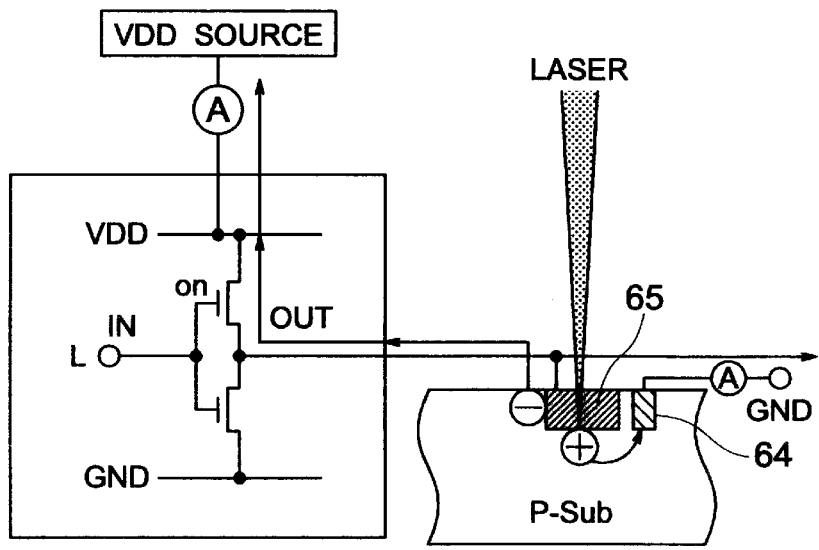
FIG. 6 is a sectional view for showing laser irradiation onto the irradiation node in FIG. 4 in the case of a low level of the input signal.
Figure 7:
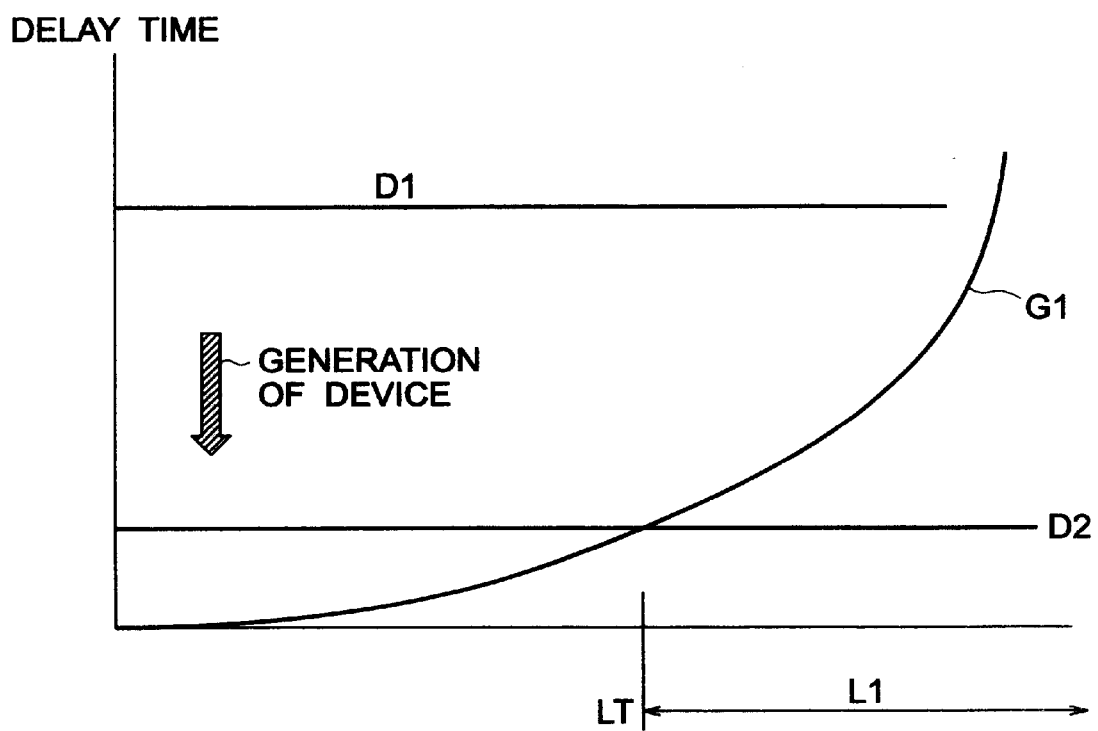
FIG. 7 is a graph for showing relationship between the line length and the delay time in the state of art semiconductor devices.

Now, the present invention is more specifically described with reference to accompanying drawings, wherein similar constituent elements are designated by similar reference numerals.

Figure 8:
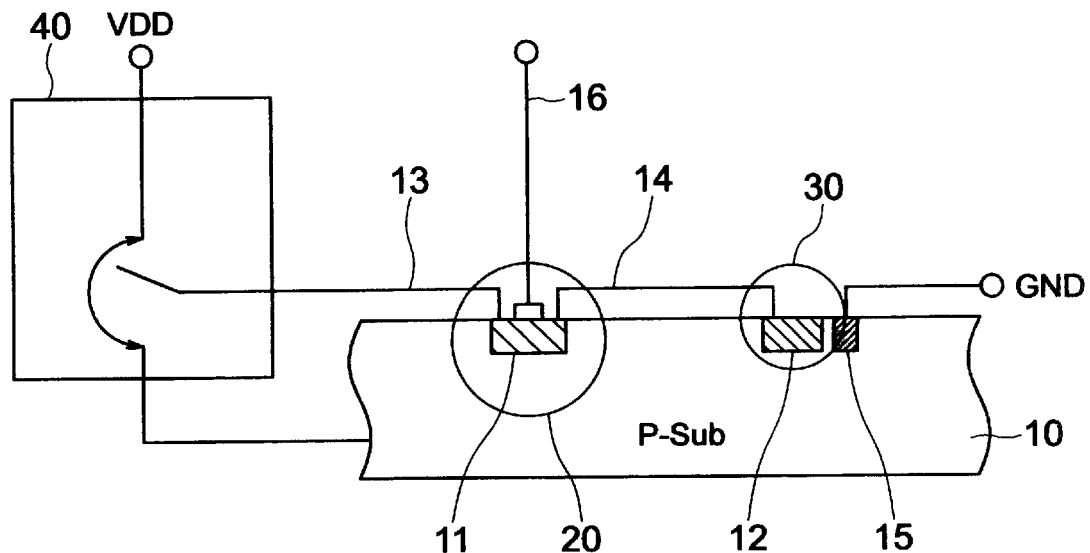
FIG. 8 is a schematic sectional view of an internal-logic inspection circuit according to a first embodiment of the present invention.
Figure 9:
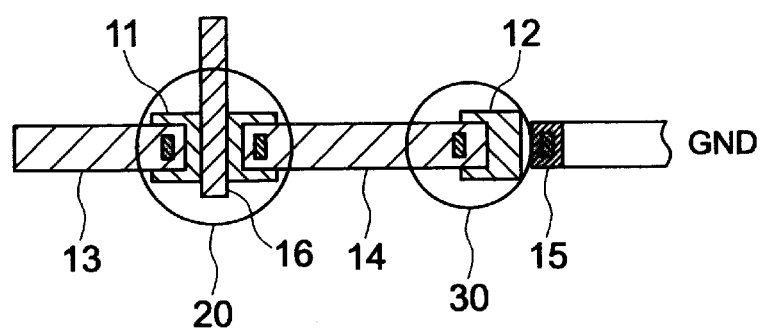
FIG. 9 is a top plan view of the internal-logic inspection circuit of FIG. 8.

Referring to FIGS. 8 and 9, an internal-logic inspection circuit according to a first embodiment of the present invention is formed on a p-type substrate 10, on which an internal circuit 40 to be subjected to an internal-logic inspection by using the internal-logic inspection circuit and a laser beam is formed. The p-type substrate 10 includes a pair of n-type diffused regions 11 and 12 formed on the surface regions of the p-type substrate 10 separated from each other. The area of n-type diffused region 11 is divided by an overlying gate electrode 16 into a first region and a second region. The first region of n-type diffused region 11 is connected to an output node (internal node) of the internal circuit 40 through an interconnect 13, and the second region of n-type diffused region 11 is connected to n-type diffused region 12 through an interconnect 14. In the vicinity of n-type diffused region 12, a substrate electrode 15 connected to the ground line is disposed on the substrate 10 for applying a reverse bias voltage.

In FIG. 9, the gate electrode 16 extends in the direction perpendicular to the direction of interconnects 13 and 14, overlying the first n-type region 11 between the contact of interconnect 13 and the contact of interconnect 14 on the n-type diffused region 11. The first region, the second region and the gate electrode 16 constitute a selector element 20, whereas the n-type region 12 and the p-type substrate 10 constitute a judgement diode 30. The selector element 20 is used for selection or activation of the inspection circuit for inspection of a specified internal node among a plurality of inspection circuits.

Figure 10:
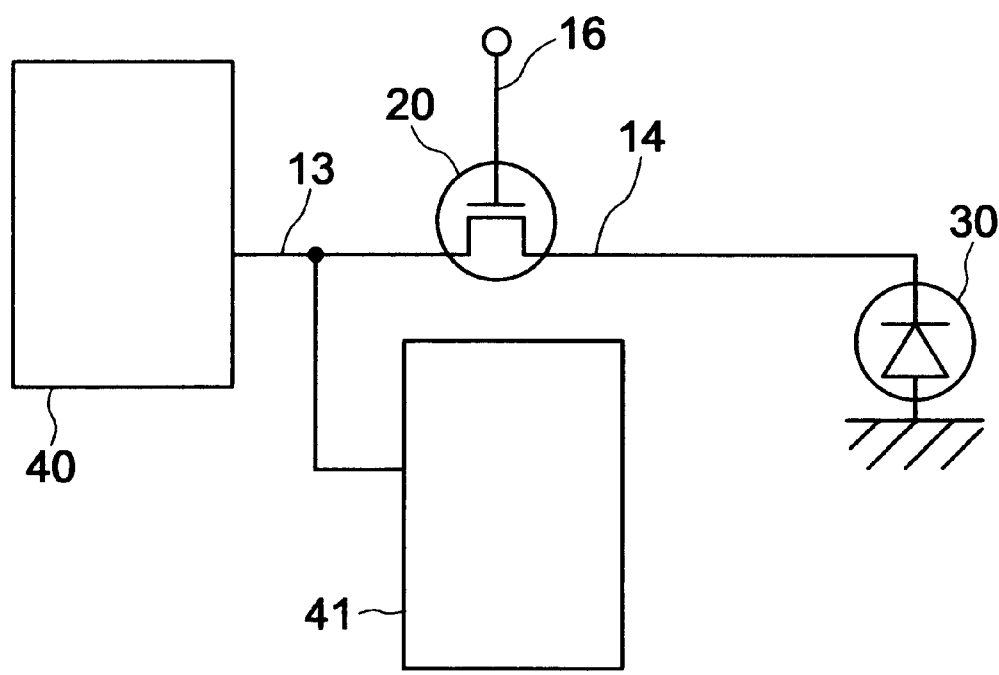
FIG. 10 is an equivalent circuit diagram of an internal-logic inspection circuit according to a second embodiment of the present invention.

Referring to FIG. 10, there is shown an internal-logic inspection circuit according to a second embodiment of the present invention in a circuit diagram format. The inspection circuit includes a selector element 20 implemented by an nMOSFET having a gate 16 connected to a pad, a drain connected to an interconnect 13 connecting internal circuits 40 and 41, and a source connected through an interconnect 14 to the cathode of the judgement diode 30, the anode of which is connected to the ground line. The selector element 20 is disposed in a channel area for receiving a number of interconnects therein. The gate electrode 16 receives a selector signal having either a high level voltage or a low level voltage from outside the chip.

In the selector element 20, if the gate electrode 16 is applied with a high level voltage, the nMOSFET in the selector element 20 is turned on, whereby the interconnect 13 connecting the internal circuits 40 and 41 is coupled to the cathode of the judgement diode 30. On the other hand, if the gate electrode 16 is applied with a low level voltage, the nMOSFET is turned off, whereby the interconnect 13 is separated from the cathode of the judgement diode 30. When interconnect 14 is applied with a high voltage from either internal circuit 40 or 41, the n-type diffused region 12 has a depletion layer therein due to a reverse bias between the p-n junction of the judgement diode 30.

Figure 11:
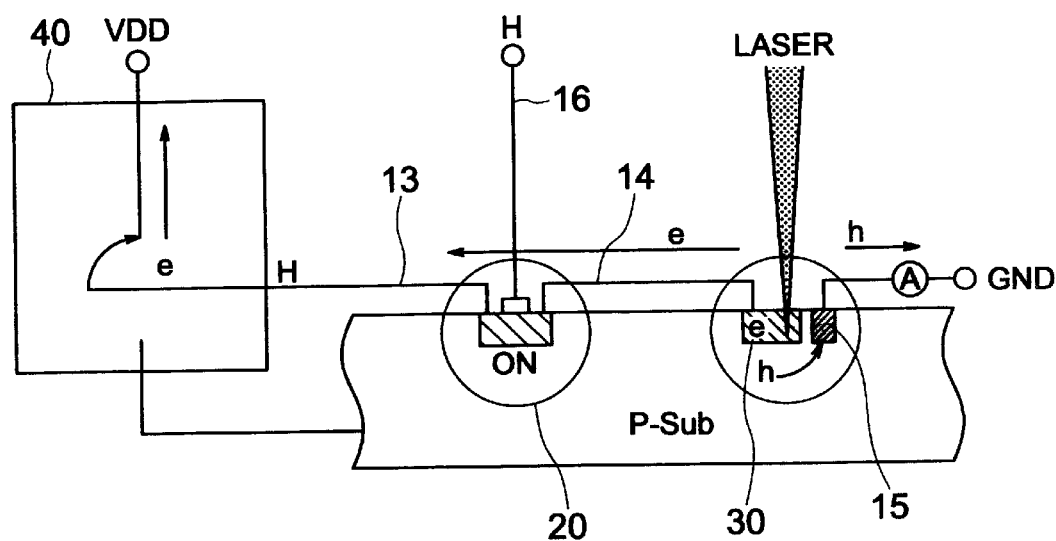
FIG. 11 is a schematic sectional view of the internal-logic inspection circuit of FIG. 8 for showing laser irradiation in the case of a low level applied to the output node.

Referring to FIG. 11 showing the internal-logic inspection circuit of FIG. 8 during logic inspection, the gate electrode 16 of the selector element 20 is applied with a high level voltage. It is assumed that the output node of the internal circuit 40 outputs a high level through the interconnect 13. When a laser beam is irradiated onto the depletion layer in the n-type region 12 of the judgement diode 30, the electrons of the electron-hole pairs generated by the laser beam are drained to the internal circuit 40 through the selector element 20, whereas the positive holes are drained to the ground line through the p-n junction of the judgement diode 30 and the substrate electrode 15. Thus, an ammeter disposed between the ground line and the substrate electrode 15 can detect current $I_{ph}$. The ammeter may be disposed between the VDD line and the interconnect 13 for detection of the current generated by the laser beam.

Figure 12:
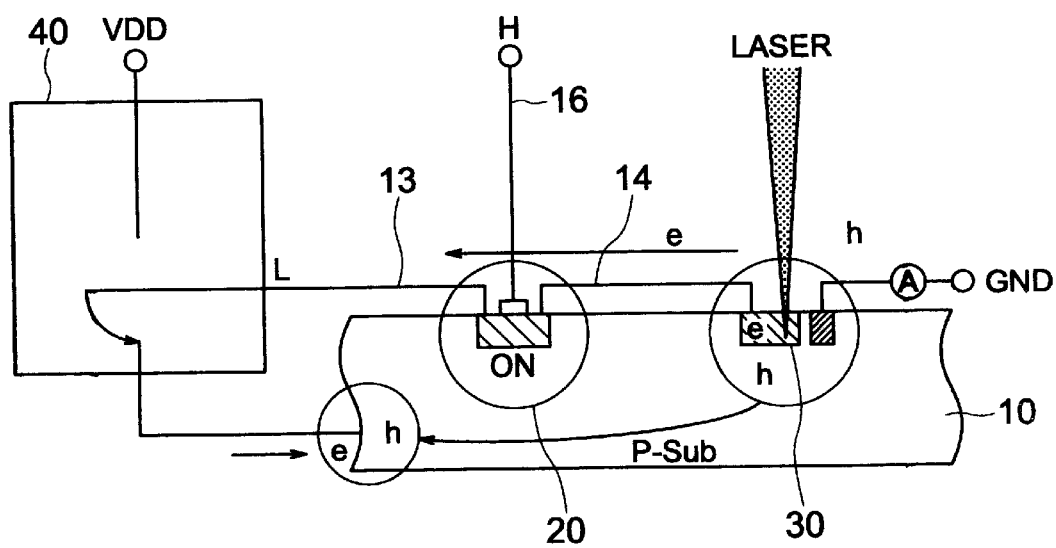
FIG. 12 is a schematic sectional view of the internal-logic inspection circuit for showing laser irradiation in the case of a high level applied to the output node.

Referring to FIG. 12, when a laser beam is irradiated onto the n-type region 12 of the judgment diode 30, with the gate electrode 16 of the selector element 20 being applied with a high level voltage and the internal circuit 40 outputting a low level signal, the positive holes are drained to the ground electrode of the internal circuit 40 through the substrate 10, whereas the electrons are drained also to the ground electrode of the internal circuit 40 through the interconnect 14, the selector element 20 and the interconnect 13. Thus, the electrons and positive holes are recombined in the ground electrode of the internal circuit 40, and the ammeter connected between the substrate electrode 15 and the ground line cannot detect current $I_{ph}$.

Figure 13:
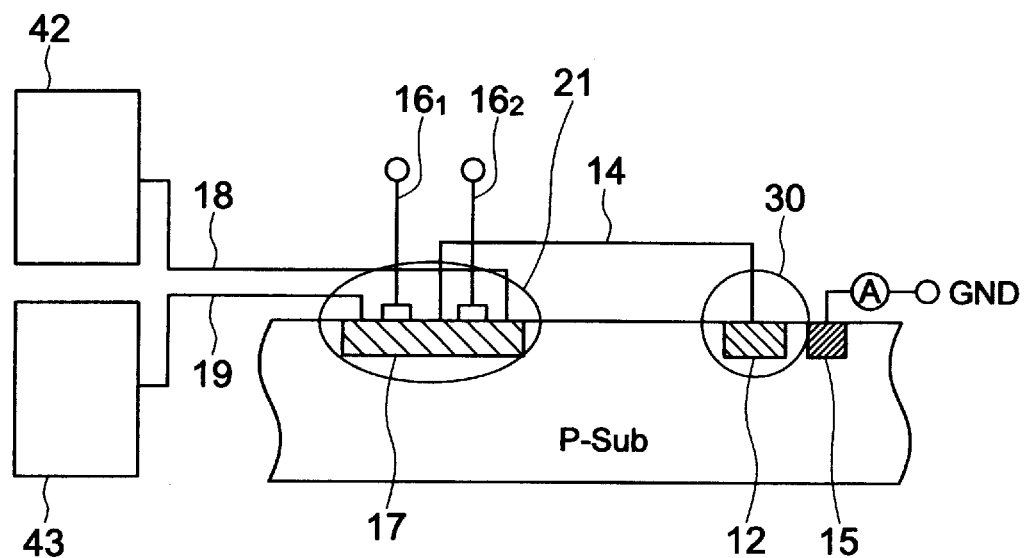
FIG. 13 is a schematic sectional view of an internal-logic inspection circuit according to a third embodiment of the present invention.
Figure 14:
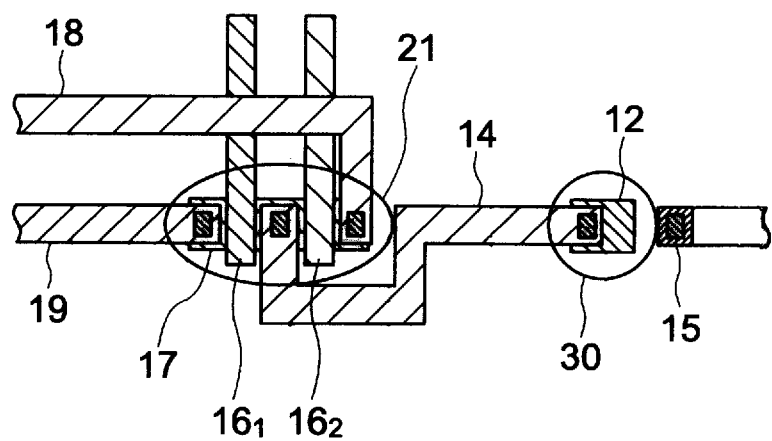
FIG. 14 is a top plan view of the internal-logic inspection circuit of FIG. 13.

Referring to FIGS. 13 and 14, an internal-logic inspection circuit according to a third embodiment of the present invention is similar to the first embodiment except for the configuration of the selector element 21 in the present embodiment, which includes a plurality (two in this case) of gate electrodes $16_1$ and $16_2$ corresponding to a plurality of internal nodes in the internal circuits 42 and 43 to be subjected to the logic inspection. More specifically, the first regions of the n-type diffused region 17 of the selector element 21 is connected to the nodes of internal circuits 42 and 43 through interconnects 18 and 19. The gate electrodes $16_1$ and $16_2$ are disposed for respective interconnects 18 and 19 between the interconnects 18 and 19 and the second region connected to interconnect 14, which is connected to the n-type diffused region 12.

For logic inspection of interconnect 18 or 19, corresponding gate electrode $16_1$ or $16_2$ is applied with a high voltage, with the other gate electrode $16_2$ or $16_1$ being applied with a low voltage, while a laser beam is irradiated onto the n-type diffused region 12 of the judgement diode 30.

Figure 15:
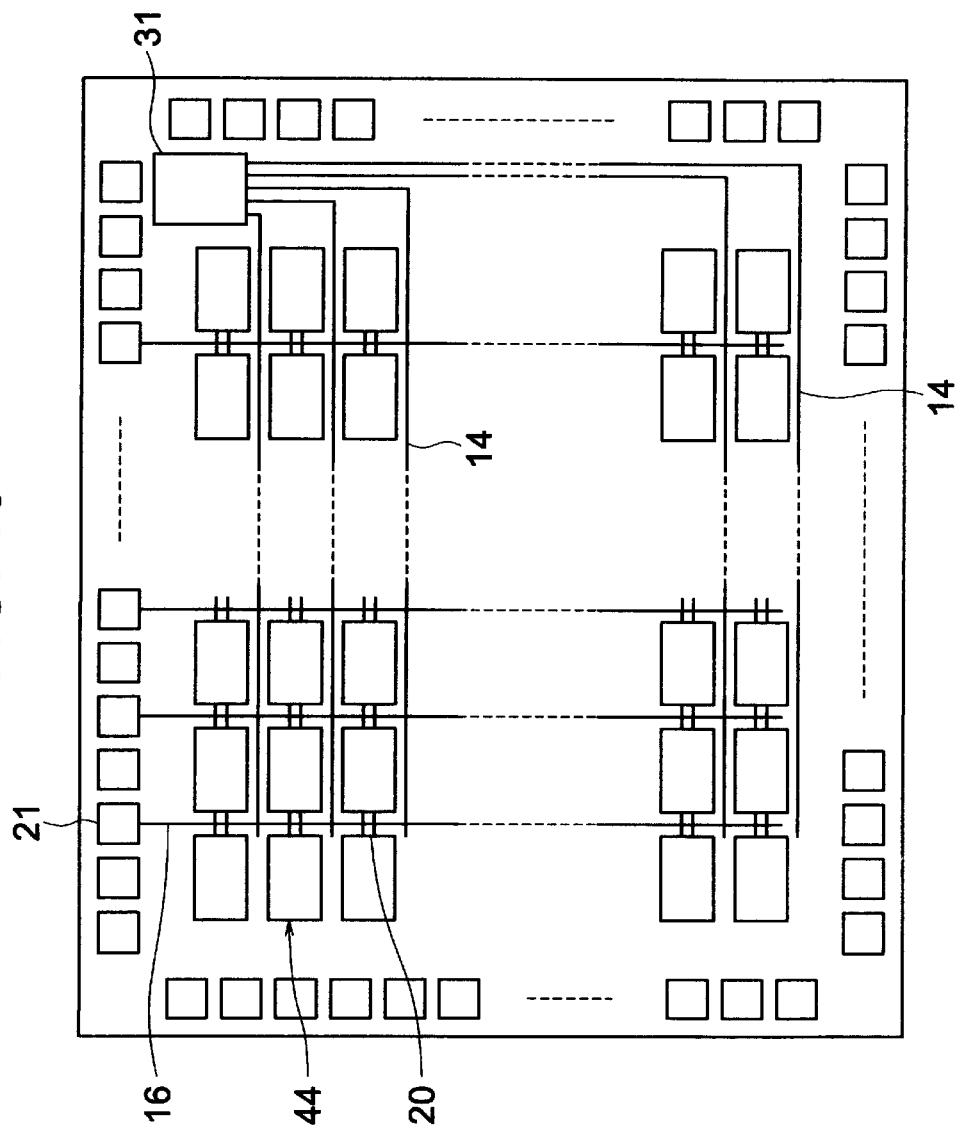
FIG. 15 is a top plan view of a semiconductor device for showing a plurality of selector elements as used in the present embodiment.

Referring to FIG. 15, arrangement of the internal-logic inspection circuit of the present invention is exemplified. The semiconductor device shown in FIG. 15 is implemented as a so-called gate array device wherein a plurality of primary logic gates 44 arranged in a matrix are connected by overlying interconnects (not shown) to have desired functions. Each selector element 20 is disposed adjacent to a corresponding primary logic gate 44 to form an array of selector elements 20. A gate line forming gate electrodes 16 of the selector elements 20 arranged in a column direction extends in the column direction and is connected to a corresponding pad 21. A plurality of judgement diodes are disposed in a diode array area 31 disposed in the vicinity of a corner of the chip. The selector elements 20 arranged in a row are connected to a corresponding one of the judgement diodes in the diode array area 31 through a common interconnect 14.

In an alternative of the arrangement of the inspection circuit of FIG. 15, a single pad and a multiplexer may be disposed for a plurality of rows of gate electrodes 16. In this case, $2^n$ rows of selector elements can be controlled by n pads.

Figure 16:
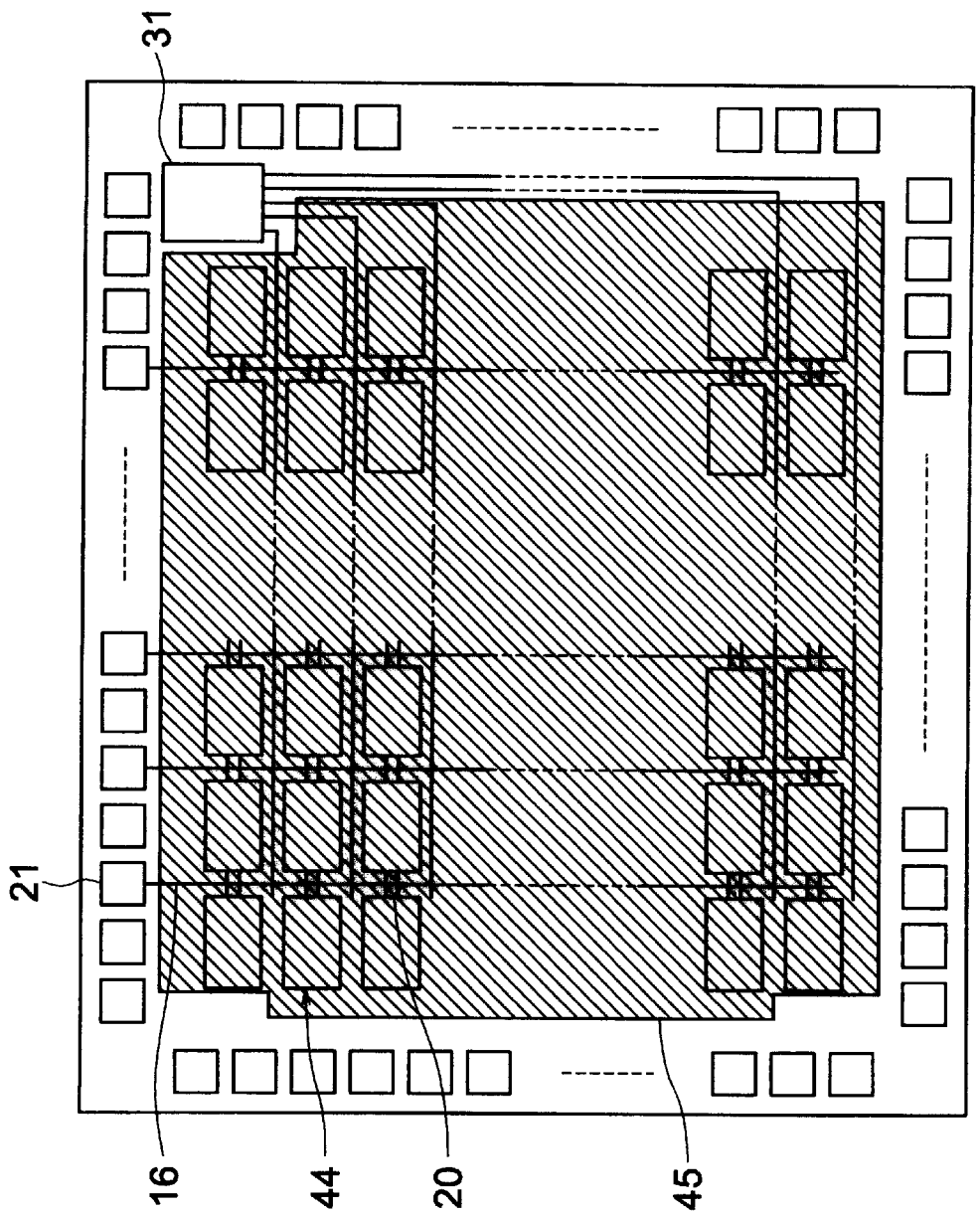
FIG. 16 is a top plan view of a semiconductor device for showing a space of a judgement diode array as used in the present embodiment.

Referring to FIG. 16, there is shown another configuration of an internal-logic inspection circuit according to an embodiment of the present invention. Each selector element 20 is disposed adjacent to a corresponding logic gate 44 similarly to the embodiment of FIG. 15. The diode array area 31 is disposed in a space in the vicinity of a corner where overlying interconnects 45 are not disposed.

Figure 17:
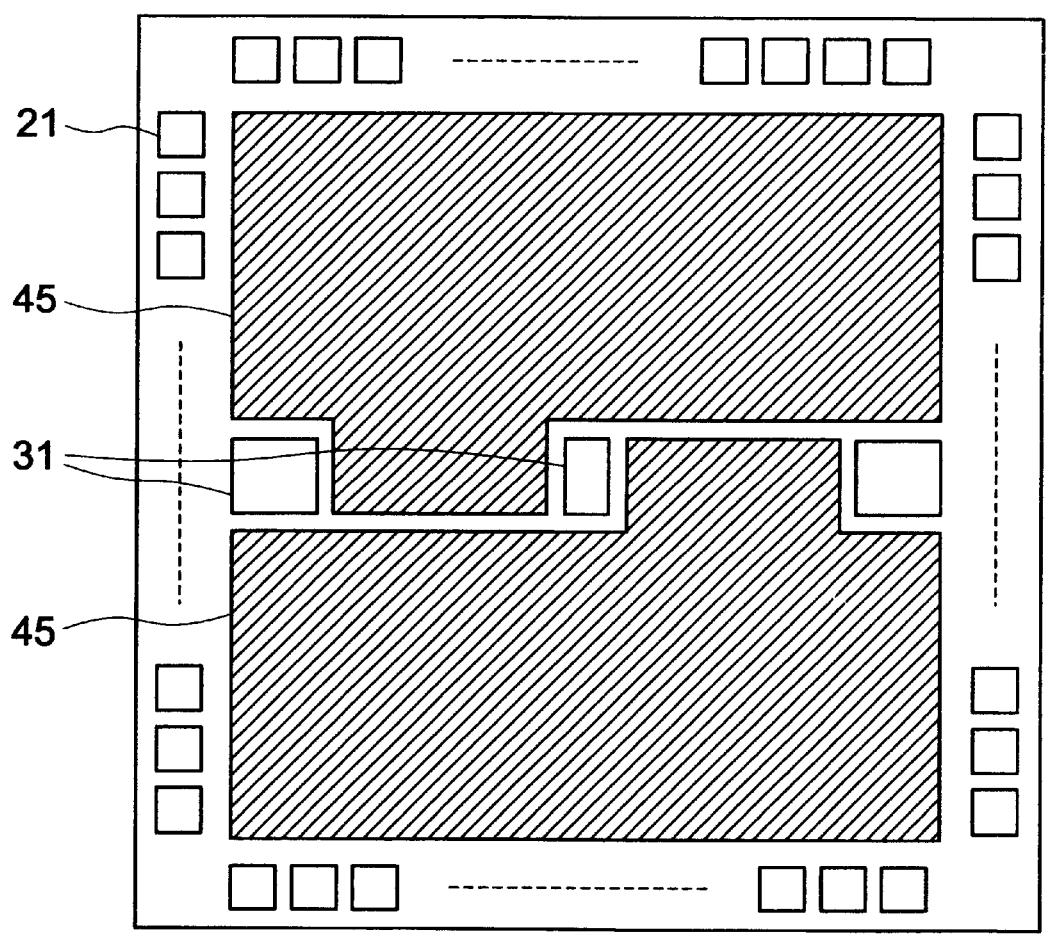
FIG. 17 is a top plan view of another semiconductor device for showing spaces of judgement diode arrays as used in the present embodiment.

Referring to FIG. 17, a further configuration of an internal-logic inspection circuit is exemplified. The inspection circuit shown in FIG. 17 includes a plurality of diode array areas 31 each disposed at a space where the overlying interconnects are not disposed.

In the present invention, the selector element 20 connected to an internal node or output node of an internal circuit does not substantially increase the parasitic capacitance of the node because the selector element 20 is disposed in the vicinity of the corresponding node and the selector element 20 is connected to the irradiation area for the judgement diode 30.

More specifically, the logic inspection circuit of the present invention adds only parasitic capacitances of the interconnect having a small length and the p-n junction of the selector element to the node of the internal circuit connected to the selector element. Thus, the internal-logic inspection circuit of the present invention does not substantially retard the high-speed operation or multi-layer structure of the semiconductor device. The location of the selector element or diode can be designed by a simulation not to retard the high-speed operation of the semiconductor device.

The judgement diodes can be disposed at any space because the interconnect between the selector element and the judgement diode does not affect the operational speed of the semiconductor device.

Since the above embodiments are described only for examples, the present invention is not limited to the above embodiments and various modifications or alterations can be easily made therefrom by those skilled in the art without departing from the scope of the present invention. For example, a laser beam may be replaced by another beam so long as the another beam excites the n-type region of the judgment diode to generate electron-hole pairs.

What is claimed is:

1. A semiconductor device comprising:

a first-conductivity-type substrate;

an internal circuit formed on said substrate and having an internal node for signal transmission;

a MOSFET including a second-conductivity-type diffused region formed on said substrate, and a gate electrode overlying said diffused region for separating said diffused region to first and second regions, said first region being connected to said internal node; and a judgement diode having a p-n junction formed of said substrate and a third region formed on said substrate and having a second-conductivity-type, said third region being connected to said second region.

2. The semiconductor device as defined in claim 1, wherein said internal circuit has a plurality of said internal nodes, and a plurality of said MOSFET are disposed in the vicinities of respective said internal nodes.

3. The semiconductor device as defined in claim 2, wherein said internal circuit has an array of logic gates having output nodes constituting respective said nodes, said plurality of said MOSFET are disposed in an array, and a plurality of said judgement diodes are disposed corresponding to a row of said array of said MOSFET.

4. The semiconductor device as defined in claim 3, wherein said gate electrodes of said plurality of said MOSFET disposed in a column is connected to a pad, and said second regions of said plurality of said MOSFET disposed in a row is connected to a corresponding one of said plurality of said judgement diode.

5. The semiconductor device as defined in claim 3, wherein said plurality of said judgement diodes are disposed in a space where overlying interconnects are not disposed.

6. The semiconductor device as defined in claim 3, wherein a pair of said MOSFET share said second region.

7. The semiconductor device as defined in claim 1, further comprising another internal circuit having another internal node, wherein said first region of said MOSFET is disposed in a vicinity of an interconnect connecting said internal node and said another internal node.

8. The semiconductor device as defined in claim 1, wherein said gate electrode is connected to a pad disposed in a vicinity of a peripheral area of a chip of said semiconductor device.

9. A method for inspecting a logic level of the internal node in the semiconductor device as defined in claim 1, said method comprising the steps of irradiating said third region by using a exciting beam for generation of electron-hole pairs in said third region, and measuring a current flowing in the semiconductor device.

* * * * *